(12) United States Patent
Seki et al.

(10) Patent No.: US 10,288,649 B2
(45) Date of Patent: May 14, 2019

(54) CURRENT SENSOR AND MEASURING APPARATUS

(71) Applicant: HIOKI DENKI KABUSHIKI KAISHA, Nagano (JP)

(72) Inventors: Kenichi Seki, Nagano (JP); Kazunobu Hayashi, Nagano (JP); Hajime Yoda, Nagano (JP)

(73) Assignee: HIOKI DENKI KABUSHIKI KAISHA, Nagano (JP)

( * ) Notice: Subject to any disclaimer, the term of this patent is extended or adjusted under 35 U.S.C. 154(b) by 239 days.

(21) Appl. No.: 15/292,508

(22) Filed: Oct. 13, 2016

(65) Prior Publication Data

US 2017/0115328 A1    Apr. 27, 2017

(30) Foreign Application Priority Data

Oct. 26, 2015   (JP) ................................. 2015-209529

(51) Int. Cl.
| | |
|---|---|
| *G01R 15/18* | (2006.01) |
| *G01R 19/00* | (2006.01) |
| *G01R 35/00* | (2006.01) |

(52) U.S. Cl.
CPC ......... *G01R 15/186* (2013.01); *G01R 15/185* (2013.01); *G01R 19/0092* (2013.01); *G01R 35/00* (2013.01)

(58) Field of Classification Search
CPC .... G01R 15/186; G01R 15/185; G01R 15/18; G01R 15/183; G01R 15/188; G01R 15/181; G01R 15/247; G01R 19/0092; G01R 19/20; G01R 19/15; G01R 19/2506; G01R 19/165; G01R 35/00; G01R 35/005; G01R 33/04; G01R 33/0023; G01R 33/02;
(Continued)

(56) References Cited

U.S. PATENT DOCUMENTS 3,882,387 A * 5/1975 Vikstrom ............. G01R 15/185
324/117 R
4,847,554 A * 7/1989 Goodwin ............. G01R 15/185
324/127
(Continued)

FOREIGN PATENT DOCUMENTS

JP            4842275        10/2011
WO      2006/048020        5/2006

*Primary Examiner* — Lee E Rodak
(74) *Attorney, Agent, or Firm* — Greenblum & Bernstein, P.L.C.

(57) ABSTRACT

A current sensor includes: a magnetic core that surrounds a detected object; a first sensor with a first sub-magnetic core incorporated in the magnetic core and a first winding wound around the first sub-magnetic core; a second sensor with a second sub-magnetic core incorporated in the magnetic core and a second winding wound around the second sub-magnetic core in the opposite direction to the first winding; a signal generator outputting signals to magnetize the first and second windings with inverted phases; a detector outputting a detection signal whose amplitude is proportionate to a current in the detected object based on the difference between first and second voltage signals generated in the first and second windings; and a waveform adjuster that is connected to at least one of the first and the second windings and adjusts the waveform of a voltage signal generated by the connected winding.

8 Claims, 6 Drawing Sheets

(58) Field of Classification Search
CPC ...... G01R 33/045; G01R 33/096; G01R 1/00; G01R 31/025; H01F 38/32; H01F 38/30; H01F 2038/305
See application file for complete search history.

(56) References Cited

U.S. PATENT DOCUMENTS

| | | | | |
|---|---|---|---|---|
| 5,008,612 | A * | 4/1991 | Otto | G01R 19/20 323/356 |
| 5,168,223 | A * | 12/1992 | Le Thiec | G01R 33/045 324/253 |
| 5,345,169 | A * | 9/1994 | Etter | G01R 15/185 324/117 R |
| 6,984,979 | B1 * | 1/2006 | Edel | G01R 15/185 324/253 |
| 2003/0071609 | A1 * | 4/2003 | Blakely | G01R 15/183 324/127 |
| 2014/0055131 | A1 * | 2/2014 | Rybalko | G01R 33/02 324/253 |
| 2015/0233977 | A1 * | 8/2015 | Platise | G01R 15/20 324/117 R |
| 2015/0276816 | A1 * | 10/2015 | Yoshida | G01R 15/185 324/244 |
| 2018/0131173 | A1 * | 5/2018 | Iwami | H02H 3/16 |

* cited by examiner

F I G. 9
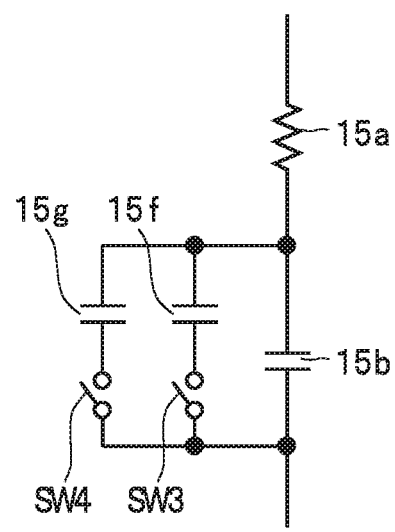

F I G. 1 0
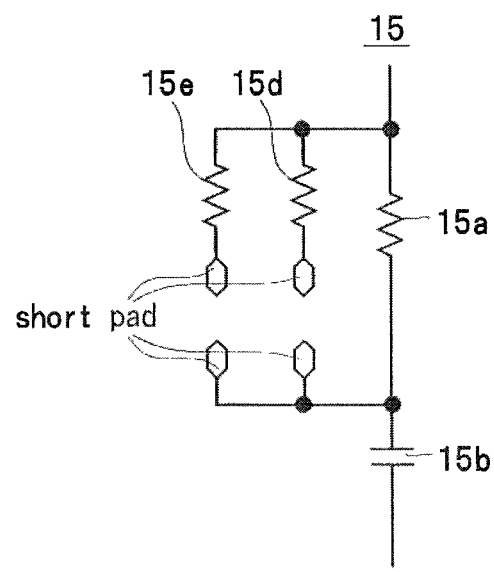
F I G. 1 1
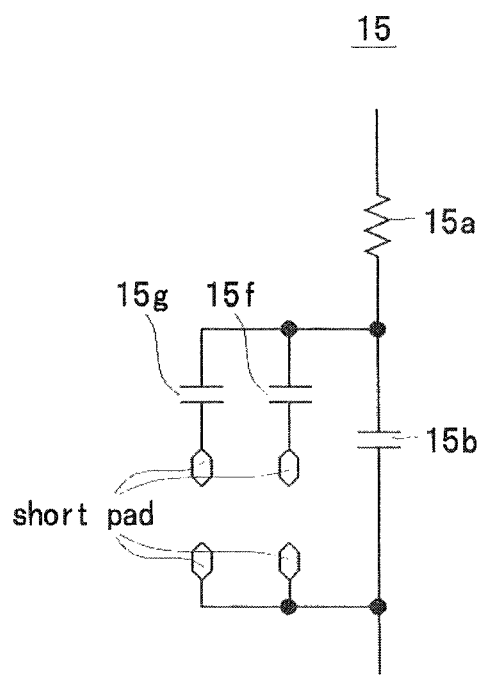

CURRENT SENSOR AND MEASURING APPARATUS

FIELD OF THE INVENTION

The present invention relates to a current sensor, which is equipped with a ring-shaped main magnetic core through which a detected object, such as a wire, is inserted and a pair of fluxgate sensor elements that are incorporated into the main magnetic core and which detects a current flowing in the detected object, and to a measuring apparatus equipped with such current sensor.

DESCRIPTION OF THE RELATED ART

A current sensor (detector circuit for measuring current) disclosed in Japanese Patent No. 4,842,275 is known as a current sensor of this type. This current sensor includes a ring-shaped main current transformer that surrounds a detected object in which a current flows (i.e., a conductor in which a main current flows), two ring-shaped auxiliary current transformers that surround the conductor on which the main current flows and are effectively the same, two windings that are wound in respectively opposite winding directions around the two auxiliary current transformers, and a compensating winding that is wound around the main current transformer and the two auxiliary current transformers. Together with the winding wound around it, each auxiliary current transformer constructs a fluxgate sensor element. Modulation signals that are antiphase are supplied to the two windings that construct the respective fluxgate sensor elements to magnetize the two auxiliary current transformers with inverted phases. The two auxiliary current transformers are driven in a saturated state and at the equilibrium point, the signal curve is symmetrical about zero.

With this current sensor, when a main current flows in a detected object, magnetic flux is generated in the same direction in the two auxiliary current transformers by the main current, but since the two auxiliary current transformers are magnetized in antiphase, the produced magnetic flux causes a transition to an unbalanced state. Also, at the connection point of the two windings wound around the two auxiliary current transformers, an error signal (voltage signal) is generated with an amplitude and polarity that depend on the magnitude and polarity of the imbalance. In this current sensor, a feedback loop is formed so that a compensating current generated using the error signal is supplied to a compensating winding and magnetic flux (magnetomotive force) induced in the main current transformer is cancelled out by the magnetic flux (magnetomotive force) induced in the main current transformer by the main current. Here, the current value of the main current is decided based on the current value of the compensating current and the number of turns in the compensating winding. This means that with this current sensor the compensation current is converted to a voltage signal by a resistance, and this voltage signal is outputted as a detection signal expressing the main current.

SUMMARY OF THE INVENTION

However, with a current sensor equipped with a fluxgate sensor element, as disclosed in Patent Document 1 mentioned above, it is necessary to make an error signal when the main current is not flowing to be as close as possible to zero by forming the two auxiliary current transformers that respectively construct the fluxgate sensor elements so as to be effectively the same (although not stated in the document, the two windings wound around the two auxiliary current transformers are also effectively the same).

However, since fluctuations will always be present in the characteristics of auxiliary current transformers fabricated with the same specification and the windings wound around such auxiliary current transformers, there is the problem to be solved that it is difficult to set the error signal and in turn the detection signal at close to zero in a state where a main current is not flowing.

The present invention was conceived in view of the above problem to be solved and has a principal object of providing a current sensor capable of placing a detection signal in a state close to zero when a current is not flowing in a detected object, and a measuring device equipped with this current sensor.

To achieve the stated object, the current sensor according to the present invention comprises a ring-shaped main magnetic core through which a detected object is inserted; a first fluxgate sensor element with a first sub-magnetic core, which is incorporated in the main magnetic core, and a first detection winding wound around the first sub-magnetic core; a second fluxgate sensor element with a second sub-magnetic core, which is incorporated in the main magnetic core, and a second detection winding wound around the second sub-magnetic core in an opposite direction to a winding direction of the first detection winding; a signal generator that outputs excitation signals to the first detection winding and the second detection winding to magnetize the first detection winding and the second detection winding with inverted phases; a detector that outputs a detection signal whose amplitude changes in proportion to a current value of a current flowing in the detected object based on a difference between a first voltage signal generated in the first detection winding and a second voltage signal generated in the second detection winding; and a waveform adjuster that is connected to at least one winding out of the first detection winding and the second detection winding and adjusts a signal waveform of a voltage signal generated by the at least one winding out of the first detection winding and the second detection winding.

In the current sensor according to the present invention, a waveform adjuster that is connected to at least one winding out of the first detection winding of a first fluxgate sensor element and the second detection winding of a second fluxgate sensor element and adjusts a signal waveform of a voltage signal generated by the at least one winding out of the first detection winding and the second detection winding is provided. Therefore, according to the current sensor according to the present invention, it is possible to adjust the signal waveform of a voltage signal generated by the one winding, and by doing so in a state where a detected object has not been inserted through the main magnetic core, it is possible to make the signal waveform of one out of the first voltage signal and the second voltage signal approach the other signal waveform. This means that it is possible to keep the difference between the first voltage signal and the second voltage signal constant at zero volts, and as a result, it is possible to perform an accurate zeroing adjustment that keeps the outputted detection signal constant at zero volts (in this specification, this expression indicates a state extremely close to zero volts). This means that with a measuring device according to the present invention equipped with the above current sensor, since it is possible to measure the current value of a current flowing in a detected object that has been inserted through the main magnetic core in a state where an accurate zeroing adjustment has been performed on the current sensor, it is possible to accurately measure the current value.

Also, the current sensor according to the present invention in the current sensor according to the present invention described above comprises the waveform adjuster includes a series circuit with a resistance element and a capacitance element and is configured so that at least one of the resistance element and the capacitance element is a variable element.

Therefore, according to the current sensor according to the present invention and the measuring device according to the present invention that is equipped with this current sensor, the waveform adjuster includes a series circuit with a resistance element and a capacitance element and is configured so that at least one of the resistance element and the capacitance element is a variable element. This means that compared to a configuration where the waveform adjuster includes an inductance element, the configuration is not susceptible to being magnetically affected by a current flowing in the detected object, which makes it possible to improve the detection precision for a current.

Also, the current sensor according to the present invention in the current sensor according to the present invention described above comprises wherein the waveform adjuster includes a series circuit with a resistance element and a capacitance element and is configured so that at least one of the resistance element and the capacitance element is connected via one of an on/off switch and a short pad in parallel to an element of a same type as the at least one of the resistance element and the capacitance element.

Therefore, according to the current sensor according to the present invention and the measuring device according to the present invention that is equipped with this current sensor, by switching an on/off switch or shorting using solder or the like between short pads, it is possible to adjust the overall value of a circuit (parallel circuit) constructed of one element out of the resistance element and the capacitance element and an element of the same type that is connected in parallel to such element. This means that compared to a configuration that uses a variable element, it is possible to reduce the adjustment time taken to make one signal waveform, out of the signal waveform of the first voltage signal generated at the first detection winding and the signal waveform of the second voltage signal generated at the second detection winding, approach the other signal waveform. Also, by providing both on/off switches (or short pads) and variable elements, adjusting first using the on/off switches (or short pads), and performing adjustment with a variable element when the intended adjustment result could not be obtained, it is possible to reduce the adjustment time compared to adjustment that uses only a variable element.

Also, the measuring device according to the present invention includes the current sensor according to the above described present invention. According to this measuring device, it is possible to achieve the effects described above.

It should be noted that the disclosure of the present invention relates to the contents of Japanese Patent Application 2015-209529 that was filed on Oct. 26, 2015, the entire contents of which are herein incorporated by reference.

BRIEF DESCRIPTION OF THE DRAWINGS

These and other objects and features of the present invention will be explained in more detail below with reference to the attached drawings, wherein:

FIG. 9 is another circuit diagram of a waveform adjuster.

FIG. 10 is another circuit diagram of a waveform adjuster including a short pad.

FIG. 11 is another circuit diagram of a waveform adjuster including a short pad.

DESCRIPTION OF THE PREFERRED EMBODIMENTS

Preferred embodiments of a current sensor and a measuring apparatus will now be described with reference to the attached drawings.

Figure 1:
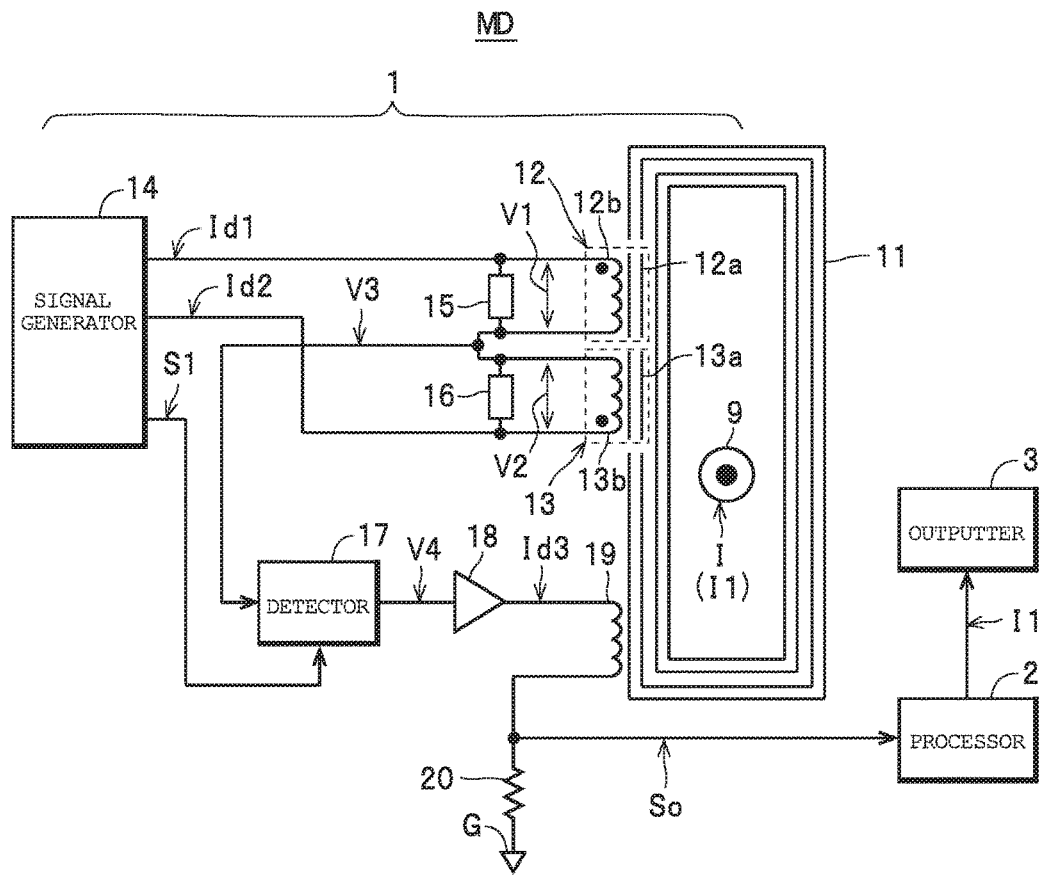
FIG. 1 is a block diagram of a measuring device equipped with a current sensor.

As depicted in FIG. 1, as one example the measuring device MD as a "measuring apparatus" for the present invention includes a current sensor 1 as a "current sensor", a processor 2, and an outputter 3, and measures a current value I1 of a current I flowing in a wire 9 as one example of a "detected object".

As depicted in FIG. 1, the current sensor 1 includes a ring-shaped main magnetic core 11 through which the detected object (the wire 9) is inserted, a first fluxgate sensor element 12 (hereinafter also referred to simply as the "first sensor element 12"), a second fluxgate sensor element 13 (hereinafter also referred to simply as the "second sensor element 13"), a signal generator 14, waveform adjusters 15 and 16 which are connected to at least one out of the first sensor element 12 and the second sensor element 13 (to both of such elements in the example in this embodiment), a detector 17, the driver 18, a feedback winding 19, and a current-to-voltage converter 20, and outputs a detection signal So whose voltage value changes in proportion to a current value I1 of a current I that flows in the wire 9 that has been inserted through the main magnetic core 11.

The main magnetic core 11 may be configured so as to be formed in a ring shape by combining two or three or more arc-shaped magnetic cores (i.e. may be splittable) or may be formed in an overall ring shape as one magnetic core (i.e., may be unsplittable). One or two concaves, not illustrated, for housing the first sensor element 12 and the second sensor element 13 are formed in the main magnetic core 11 at two positions that are separated along the circumferential direction.

The first fluxgate sensor element 12 includes a first sub-magnetic core 12a that is incorporated in the main magnetic core 11 (together with a second sub-magnetic core 13a for a configuration where only one concave is provided or in one out of the two concaves when two concaves are provided), and a first detection winding 12b that is wound around the first sub-magnetic core 12a. The second fluxgate sensor element 13 includes the second sub-magnetic core 13a that is incorporated in the main magnetic core 11

(together with the first sub-magnetic core 12a for a configuration where only one concave is provided or in the other out of the two concaves when two concaves are provided), and a second detection winding 13b that is wound around the second sub-magnetic core 13a. Aside from the winding direction of the second detection winding 13b being the opposite direction to the winding direction of the first detection winding 12b, the first sensor element 12 and the second sensor element 13 are effectively the same. The first detection winding 12b and the second detection winding 13b are also connected to one another in series by being connected to one another at first ends thereof.

The present invention is not limited to a configuration where the first sensor element 12 and the second sensor element 13 are housed in concaves formed in the main magnetic core 11 as described above, and although not illustrated, when the main magnetic core 11 has a splittable configuration, it is possible to use a configuration where the first sensor element 12 and the second sensor element 13 are housed inside gaps in the core present in the split parts (i.e., a configuration where the elements are sandwiched between the divided parts of the core) or a configuration where the first sensor element 12 and the second sensor element 13 are disposed next to such gaps.

The signal generator 14 generates, as excitation signals, two excitation currents Id1 and Id2 that are alternating currents of a certain frequency (for example, 10 kHz), that are antiphase, and have the same fixed amplitude, outputs the excitation current Id1 to a second end of the first detection winding 12b and outputs the excitation current Id2 to a second end of the second detection winding 13b.

By using this configuration, as depicted in FIG. 1, a first voltage signal V1 is generated at (i.e., across both ends of) the first detection winding 12b and a second voltage signal V2 that has inverted polarity to the first voltage signal V1 and has the first end that is connected to the first detection winding 12b as a reference is generated at (i.e., across both ends of) the second detection winding 13b. That is, the first sub-magnetic core 12a and the second sub-magnetic core 13a are magnetized with inverted phase. Also, a difference signal V3, which is the difference (V1-V2) between the first voltage signal V1 and the second voltage signal V2 and has an internal reference potential G of the current sensor 1 as a reference, is generated at the first ends of the first detection winding 12b and the second detection winding 13b that are connected to one another.

When the current I flows in the wire 9 that has been inserted through the main magnetic core 11, the magnetic flux inside the main magnetic core 11 changes due to the magnetic field generated around the wire 9, which causes changes in amplitude of the voltage signals V1 and V2. This means that the difference signal V3 is an amplitude-modulated signal where signal components with a frequency (2f) that is double the excitation currents Id1 and Id2 are modulated by the amplitude of the current I.

Although as one example in the present embodiment, the signal generator 14 generates a triangular wave current as the alternating current, the current may be a sine wave current or a rectangular wave current. The signal generator 14 generates a voltage signal with a frequency (2f) that is synchronized with the excitation currents Id1 and Id2 and outputs to the detector 17 as a synchronization signal S1.

Figure 2:
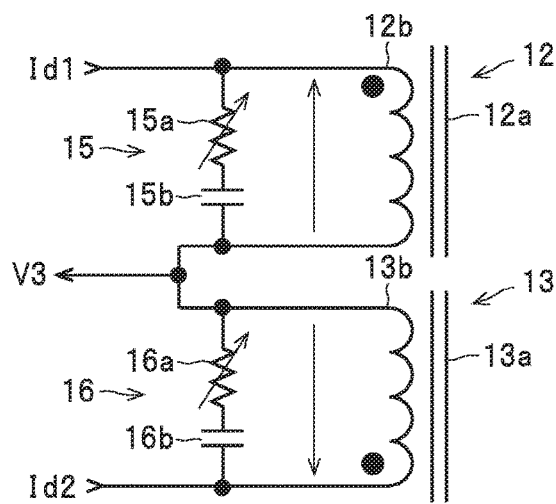
FIG. 2 is a circuit diagram of sensor elements and waveform adjusters appearing in FIG. 1.

As depicted in FIG. 2, the waveform adjuster 15 is constructed for example of a series circuit with a resistance element 15a and a capacitance element 15b, and is configured so at least one out of the resistance element 15a and the capacitance element 15b is a variable element. The waveform adjuster 15 is connected in parallel to the first detection winding 12b of the first sensor element 12. The waveform adjuster 16 is constructed for example of a series circuit with a resistance element 16a and a capacitance element 16b, and is configured so at least one out of the resistance element 16a and the capacitance element 16b is a variable element. The waveform adjuster 16 is connected in parallel to the second detection winding 13b of the second sensor element 13.

Here, although it is possible to use a configuration where only the capacitance elements 15b and 16b are variable elements (that is, capacitance elements with variable capacitances or so-called "variable" or "trimmer" capacitors), the variable range of a typical variable capacitor is narrower than the variable range of a variable resistor. For this reason, to increase the range of adjustment of the waveform adjusters 15 and 16 in the present embodiment, a configuration is used where the resistance elements 15a and 16a are variable elements (that is, resistance elements with variable resistances or so-called "variable resistors"). Note that although it is possible to use a configuration where both the resistance elements 15a and 16a and the capacitance elements 15b and 16b are variable elements and doing so increases the freedom of adjustment, there is an increase in the possible combinations of adjustments that can be made, which makes adjustment more time-consuming. For this reason, it is preferable for only one of the resistance elements 15a and 16a and the capacitance elements 15b and 16b (preferably the resistance elements 15a and 16a as described above) to be variable elements. Also, with the configuration described above, elements with the same resistance values are used as the resistance elements 15a and 16a and elements with the same capacitance values are used as the capacitance elements 15b and 16b.

For configurations where variable elements are used for only one of the resistance elements 15a and 16a and the capacitance elements 15b and 16b (preferably the resistance elements 15a and 16a as described above), to significantly reduce the time taken by adjustment, it is also possible to use a configuration where a variable element is used for only one element out of the selected pair of elements (for example, only the resistance element 15a out of the pair of resistance elements 15a and 16a selected to be made variable). In this case, the variable range of the value of the variable element (the resistance value of a resistance element or the capacitance value of a capacitance element) is set so as to include the value of the fixed element.

The waveform adjusters 15 and 16 are not limited to being configured as series circuits with a resistance element and a capacitance element, and it is also possible to use a configuration where any two of a resistance element, a capacitance element, and an inductance element are combined (i.e., a series circuit in which a resistance element and an inductance element are combined, or a series circuit in which a capacitance element and an inductance element are combined). However, with a configuration including an inductance element, there are cases where there are external magnetic effects (for example, magnetic effects due to the current I flowing in the wire 9) on the adjustment step described later. For this reason, in the present embodiment, a series circuit with a resistance element and a capacitance element is used.

As depicted in FIG. 1, the detector 17 synchronously detects the difference signal V3 using a synchronization signal S1 outputted from the signal generator 14, and by doing so, outputs the voltage signal V4 that is a detection signal whose amplitude changes in proportion to the current value I1 of the current I flowing in the wire 9.

The driver 18 inputs the voltage signal V4 outputted from the detector 17, converts the voltage signal V4 to a driving current Id3, and outputs to the feedback winding 19. Here, due to the driving current Id3 flowing in the feedback winding 19, magnetic flux is generated in the feedback winding 19. The driver 18 controls the amplitude (current value) of the driving current Id3 so as to cancel out the magnetic flux generated in the main magnetic core 11 due to the current I flowing in the wire 9 using the magnetic flux generated in the main magnetic core 11 due to the driving current Id3 flowing in the feedback winding 19, or in other words to reduce the amplitude of the difference signal V3 (so as to approach zero). Accordingly, the current sensor 1 is constructed as a so-called "zero flux" current sensor and the current value of the driving current Id3 changes in proportion to the current value of the current I flowing in the wire 9.

The feedback winding 19 is wound around the main magnetic core 11. As one example, as depicted in FIG. 1, the current-to-voltage converter 20 is constructed of a resistance element that is connected at one end to the feedback winding 19 and is connected at the other end to a part at the internal reference potential G. With this configuration, the current-to-voltage converter 20 converts the driving current Id3 flowing to the internal reference potential G from the feedback winding 19 via the current-to-voltage converter 20 to a detection signal So as a voltage signal and outputs the detection signal So. Note that in place of the configuration described above, the current-to-voltage converter 20 can be configured so as to convert the driving current Id3 to the detection signal So by supplying the driving current Id3 to a feedback resistor of an operational amplifier.

As one example, the processor 2 is configured using an A/D convertor that converts the detection signal So to a digital signal showing the instantaneous values of the detection signal So and a computer that measures the current value I1 of the current I flowing in the wire 9 based on such digital signal. The processor 2 also outputs the measured current value I1 to the outputter 3. The outputter 3 is constructed of a display apparatus, such as a liquid crystal display apparatus, and displays the current value I1 outputted from the processor 2 on a screen. Note that it is possible to use a configuration where the outputter 3 is constructed of an interface apparatus that transmits data to an external apparatus and the measured current value I1 is outputted to an external apparatus via the outputter 3, and to use a configuration where the outputter 3 is constructed of an interface apparatus that stores data on a removable medium and the measured current value I1 is stored on the removable medium via the outputter 3.

Next, the various operations of the current sensor 1 and the measuring device MD will be described with reference to the drawings.

When in the operating state, the signal generator 14 in the current sensor 1 of the measuring device MD outputs the excitation current Id1 with the frequency f to the first detection winding 12b of the first sensor element 12 and outputs the excitation current Id2 that has the same frequency f and the same amplitude as the excitation current Id1 to the second detection winding 13b of the second sensor element 13 so as to be antiphase with the excitation current Id1. The signal generator 14 also outputs the synchronization signal S1 that has the frequency (2f) and is synchronized with the excitation currents Id1 and Id2 to the detector 17.

Figure 3:
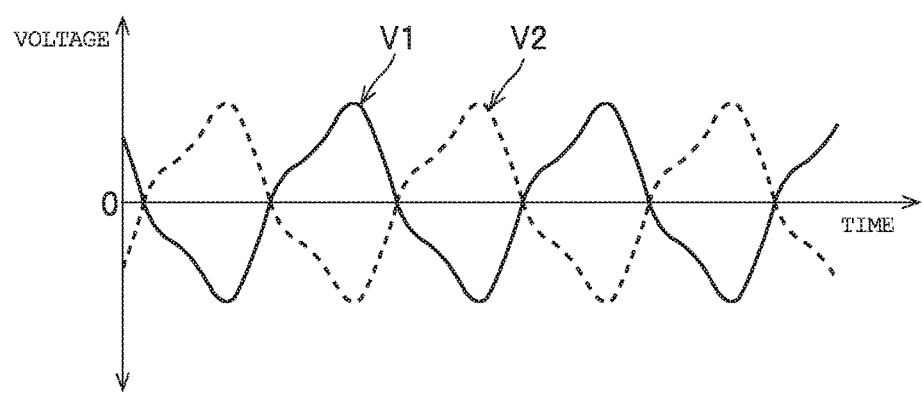
FIG. 3 is a signal waveform diagram of voltage signals generated by first detection windings of the sensor elements.

Here, in a state where a wire 9 has not been inserted through the main magnetic core 11, if the specifications of the first sensor element 12 and the second sensor element 13 are the same (i.e., the specifications of the sub-magnetic cores 12a and 13a and the specifications of the detection windings 12b and 13b, more specifically the frequency characteristics of the impedance of the detection windings 12b and 13b when wound around the sub-magnetic cores 12a and 13a) and the specifications of the waveform adjusters 15 and 16 (i.e., the specifications of the resistance elements 15a and 16a and the capacitance elements 15b and 16b) are the same, as depicted in FIG. 3 it is preferable for the first voltage signal V1 and the second voltage signal V2, which are generated in the first detection winding 12b and the second detection winding 13b that are excited by the excitation currents Id1 and Id2 that are antiphase but have the same frequency f and amplitude, to have the same signal waveform with only inverted polarity.

By doing so, the difference signal V3 that is the voltage difference (V1-V2) between the first voltage signal V1 and the second voltage signal V2 becomes constant at zero volts, so that the voltage signal V4 outputted from the detector 17 becomes constant at zero volts and the driving current Id3 outputted from the driver 18 becomes also constant at zero amps and the detection signal So outputted from the current sensor 1 also becomes constant at zero volts. As a result, the current value I1 of the current I measured by the processor 2 based on the detection signal So becomes zero amperes and a value indicating zero amperes is displayed by the outputter 3.

However, in reality, the sensor elements used as the first sensor element 12 and the second sensor element 13 will definitely be subject to fluctuations in characteristics (the frequency characteristics of impedance described above), even when the elements have been fabricated with the same specification. For this reason, when the current sensor 1 is manufactured, two sensor elements with as little fluctuation as possible (i.e., elements whose characteristics match as much as possible) are selected and used as the first sensor element 12 and the second sensor element 13. More specifically, as depicted in FIG. 4, two sensor elements are selected so that there is little discrepancy in characteristics at the low frequency end (in the present embodiment, a band of frequencies equal to or below a frequency f (for example, 10 kHz), even if some discrepancy in characteristics remains at the high frequency end (in the present embodiment, a band of frequencies in excess of the frequency f (for example, 10 kHz).

Figure 4:
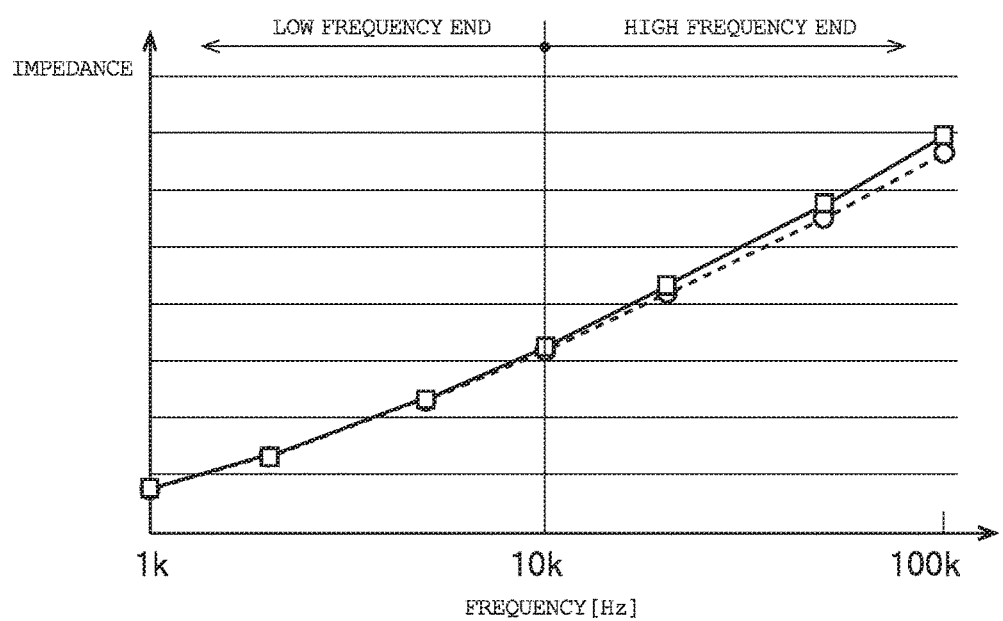
FIG. 4 is a frequency characteristics graph for the impedances of the sensor elements.

However, even if two sensor elements with the least possible discrepancies (i.e., with characteristics that match to the greatest extent possible) are used in this way as the first sensor element 12 and the second sensor element 13, as depicted in FIG. 3, since the harmonic components at the high-frequency end shown in FIG. 4 are also included in a first voltage signal V1 and a second voltage signal V2 for which distortion has occurred, even in a state where a wire 9 has not been inserted through the main magnetic core 11, the signal waveforms of the first voltage signal V1 and the second voltage signal V2 do not have the same shape and the difference signal V3 does not become constant at zero volts. Since the voltage signal V4, the driving current Id3 and the detection signal So described above do not become constant at zero, the current value I1 measured by the processor 2 and displayed on the outputter 3 does not become zero amperes.

For this reason, when manufacturing the measuring device MD, in a state where the wire 9 is not inserted through the main magnetic core 11, an adjustment step that changes (or "adjusts") the resistance value is carried out by operating at least one of the resistance elements 15a and 16a out of the waveform adjusters 15 and 16 while checking the current value I1 displayed by the outputter 3 so that the current value I1 becomes zero.

Since the waveform adjusters 15 and 16 of the measuring device MD are each constructed by a series circuit with a resistance element and a capacitance element, by changing the resistance value of the resistance elements in the waveform adjusters 15 and 16, it is possible to adjust the amount of current components at the high-frequency end that flow via the resistance element and the capacitance element (that is, the amount of the current components at the high-frequency end that bypass the windings out of the excitation currents outputted to the first detection winding 12b and the second detection winding 13b). In this way, by changing the resistance values of the resistance elements in the waveform adjusters 15 and 16, it is possible to adjust the amount of current components at the high-frequency end included in the excitation currents that flow into the first detection winding 12b and the second detection winding 13b. This means that with the measuring device MD, by operating at least one of the resistance elements 15a and 16a out of the waveform adjusters 15 and 16 to adjust the amount of high-frequency current components that flow to at least one of the adjustment circuits, it is possible to make the signal waveform of one out of the signal waveforms of the first voltage signal V1 and the second voltage signal V2 approach the other signal waveform, and as a result, it is possible to make the difference signal V3 constant at zero volts (that is, an adjustment operation that makes the displayed current value I1 zero amperes is possible).

When measuring the current value I1 of the current I flowing in the wire 9 using the measuring device MD, the wire 9 is inserted through the main magnetic core 11.

In this state, magnetic flux generated around the wire 9 due to the flowing current I passes inside the main magnetic core 11 and also passes into the sub-magnetic cores 12a and 13a of the sensor elements 12 and 13 incorporated inside the main magnetic core 11. The magnetic flux caused by the current I passes in the same direction (i.e., the same direction in the circumferential direction of the main magnetic core 11) inside the first sub-magnetic core 12a and the second sub-magnetic core 13a that are magnetized with respectively inverted phase. This means that there is an increase in magnetic flux inside the sub-magnetic core, out of the first sub-magnetic core 12a and the second sub-magnetic core 13a, that is magnetized in the same direction as the generated magnetic flux and a decrease in magnetic flux inside the other sub-magnetic core that is magnetized in the opposite direction to the generated magnetic flux, and as a result, a difference in amplitude is produced between the first voltage signal V1 and the second voltage signal V2 generated in the detection windings wound around the respective sub-magnetic cores, and as described above, the difference signal V3 is outputted as an amplitude-modulated signal in which signal components of double the frequency (2f) of the excitation currents Id1 and Id2 are modulated by the amplitude of the current I.

By performing synchronous detection of the difference signal V3 using the synchronization signal S1, the detector 17 outputs the voltage signal V4 whose amplitude changes in proportion to the current value I1 of the current I flowing in the wire 9. When the voltage signal V4 is inputted, the driver 18 converts the voltage signal V4 to the driving current Id3 and outputs the driving current Id3 to the feedback winding 19. The driver 18 also controls the amplitude (current value) of the driving current Id3 so that the amplitude (voltage) of the voltage signal V4 falls (i.e., approaches zero). Here, in a state where the amplitude (voltage) of the voltage signal V4 has become zero, a state is produced where the total magnetic flux generated in the main magnetic core 11 becomes zero, that is, the magnetic flux generated in the main magnetic core 11 due to the current I flowing in the wire 9 is canceled out by the magnetic flux generated in the main magnetic core 11 due to the driving current Id3 flowing to the feedback winding 19. That is, the driver 18 outputs the driving current Id3 whose current value is proportional to the current value I1 of the current I (i.e., a current with a current value obtained by dividing the current value I1 by the number of turns in the feedback winding 19).

The current-to-voltage converter 20 converts the driving current Id3 to the detection signal So and outputs to the processor 2. The processor 2 measures the current value I1 of the current sensor 1 based on the detection signal So and outputs the measured current value I1 to the outputter 3 to have the current value I1 displayed on the screen. By doing so, measurement of the current value I1 of the current I flowing in the wire 9 is completed.

In this way, with the current sensor 1 of the measuring device MD, the waveform adjuster 15 is provided for the first sensor element 12 and the waveform adjuster 16 is provided for the second sensor element 13. Therefore, according to the current sensor 1, by adjusting at least one out of the waveform adjusters 15 and 16 in a state where a wire 9 is not inserted through the main magnetic core 11, it is possible for the signal waveform of one out of the first voltage signal V1 generated by the first sensor element 12 and the second voltage signal V2 generated by the second sensor element 13 to approach the other signal waveform, which makes the difference signal V3 constant at zero volts. As a result, it is possible to accurately perform a zeroing adjustment that sets the outputted detection signal So at a constant zero volts (a state that is extremely close to zero).

This means that according to the current sensor 1 and the measuring device MD, since it is possible to measure the current value I1 of the current I flowing in the wire 9 inserted through the main magnetic core 11 in a state where an accurate zeroing adjustment has been performed on the current sensor 1, it is possible to accurately measure the current value I1.

Also, in the current sensor 1, the waveform adjuster 15 is constructed so as to include a series circuit with the resistance element 15a and the capacitance element 15b, at least one out of the resistance element 15a and the capacitance element 15b (in the present embodiment, the resistance element 15a) is constructed of a variable element, the waveform adjuster 16 is constructed so as to include a series circuit with the resistance element 16a and the capacitance element 16b, and at least one out of the resistance element 16a and the capacitance element 16b (in the present embodiment, the resistance element 16a) is constructed of a variable element. Therefore, according to the current sensor 1 and the measuring device MD equipped with the current sensor 1, compared to a configuration that includes an inductance element, the configuration is not susceptible to being magnetically affected by the current I flowing in the wire 9, which makes it possible to improve the detection precision for the current I and in turn the measurement precision for the current value I1 of the current I.

Note that although the above example uses a configuration where the waveform adjusters 15 and 16, which are constructed of series circuits with a resistance element and a capacitance element and at least one of the elements is constructed of a variable element, are connected to both the first sensor element 12 and the second sensor element 13, though not illustrated, it is also possible to use a configuration where only one out of the waveform adjusters 15 and 16 includes a variable element and the other is constructed of a series circuit with a fixed resistance element and a fixed capacitance element. Also, in place of a configuration where the waveform adjusters 15 and 16 are connected to both the first sensor element 12 and the second sensor element 13, although not illustrated, it is possible to use a configuration where only one of the first sensor element 12 and the second sensor element 13 is connected to a waveform adjuster. However, when such configuration is used, the balance between the first sensor element 12 and the second sensor element 13 is susceptible to breakdown and the operation of making one signal waveform out of the signal waveforms of the first voltage signal V1 generated by the first sensor element 12 and the second voltage signal V2 generated by the second sensor element 13 approach the other signal waveform may become difficult. Accordingly, a configuration where waveform adjusters are connected to both the first sensor element 12 and the second sensor element 13 is preferable.

Figure 5:
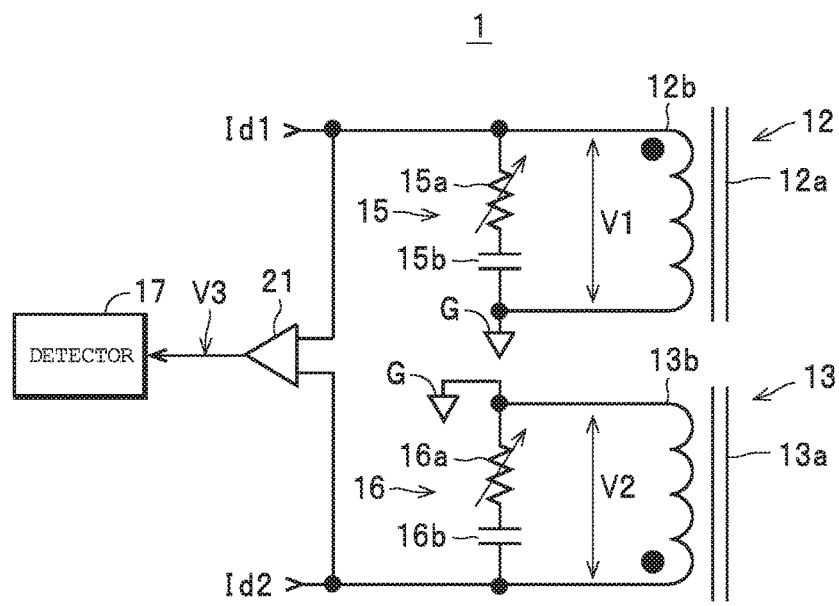
FIG. 5 is another circuit diagram of sensor elements and waveform adjusters.

Also, although a configuration is used where a voltage signal generated at the first ends of the first detection winding 12b and the second detection winding 13b that are connected to each other is outputted to the detector 17 as the difference signal V3, the present invention is not limited to this configuration and it is possible to generate the difference signal V3 using the configuration depicted in FIG. 5. This configuration will now be described with reference to FIG. 5. Note that configurations that are the same as the configuration of the current sensor 1 described above have been assigned the same reference numerals and duplicated description thereof is omitted.

With the configuration depicted in FIG. 5, the first ends of the first detection winding 12b and the second detection winding 13b that are connected to each other in FIG. 2 are instead connected to parts of the current sensor 1 that are set at the internal reference potential G. The first voltage signal V1 generated at the second end of the first detection winding 12b and the second voltage signal V2 generated at the second end of the second detection winding 13b are inputted into a newly added differential amplifier 21. By doing so, it is possible to generate (output) the difference signal V3 that is the voltage difference (V1-V2) between the first voltage signal V1 and the second voltage signal V2 from the differential amplifier 21.

Figure 6:
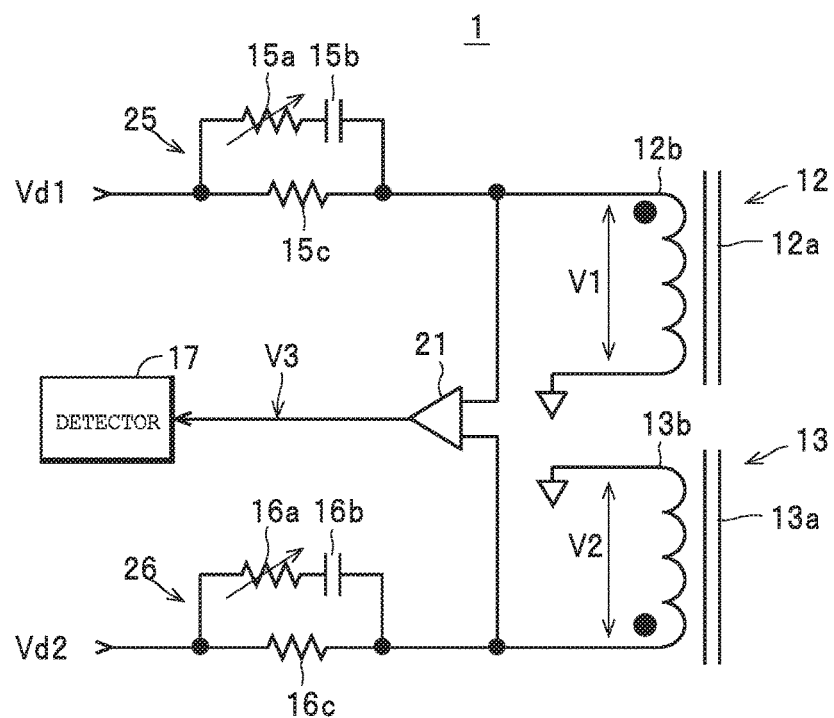
FIG. 6 is another circuit diagram of sensor elements and waveform adjusters.

Also, in the example described above, since a configuration is used where the first detection winding 12b and the second detection winding 13b are excited by supplying separate excitation currents Id1 and Id2 as excitation signals, the waveform adjuster 15 and the waveform adjuster 16 are respectively connected in parallel to the first detection winding 12b and the second detection winding 13b. However, as depicted in FIG. 6, it is also possible to use a configuration where the first detection winding 12b and the second detection winding 13b are excited by supplying excitation voltages Vd1 and Vd2 (voltage signals with the same frequency f and the same amplitude but which are antiphase) as excitation signals, and as depicted in FIG. 6, waveform adjusters 25 and 26 are connected in series to the first detection winding 12b and the second detection winding 13b, respectively. Note that configurations that are the same as the configurations depicted in FIG. 5 have been assigned the same reference numerals and duplicated description thereof is omitted.

Here, the waveform adjuster 25 includes, in addition to the configuration of the waveform adjuster 15 (a series circuit with the resistance element 15a and the capacitance element 15b), another resistance element 15c that is connected in parallel to the series circuit. Similarly, the waveform adjuster 26 includes, in addition to the configuration of the waveform adjuster 16 (a series circuit with the resistance element 16a and the capacitance element 16b), another resistance element 16c that is connected in parallel to the series circuit.

Figure 7:
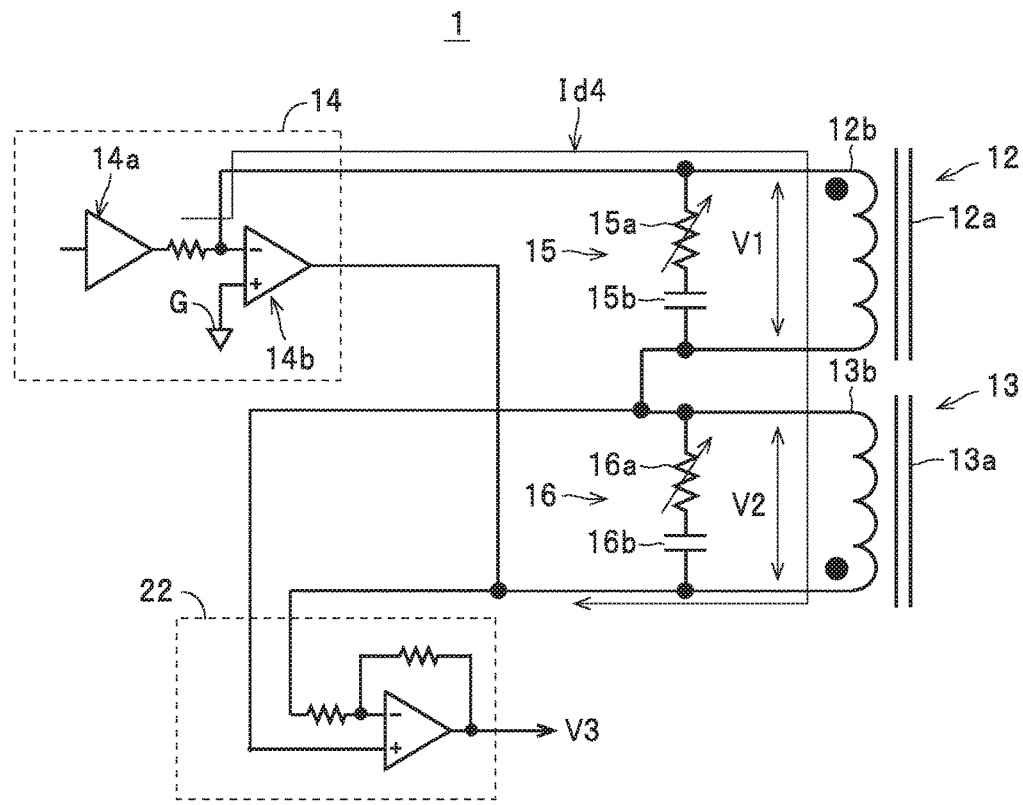
FIG. 7 is another circuit diagram of a signal generator, sensor elements, and waveform adjusters.

Also, in the example described above, although the signal generator 14 uses a configuration that supplies antiphase excitation signals, such as the excitation currents Id1 and Id2 and/or the excitation voltages Vd1 and Vd2, to the first detection winding 12b and the second detection winding 13b, respectively, as depicted in FIG. 7, it is possible to use a signal generator 14 with a configuration that supplies an excitation current Id4 as a common excitation signal to the first detection winding 12b and the second detection winding 13b. With the configuration depicted in FIG. 7, as one example the signal generator 14 is equipped with a current source 14a that outputs a triangular wave current that is an alternating current as an excitation signal (the excitation current Id4) and an operational amplifier 14b which is configured as an inverting amplifier (a current-voltage converter) and has a circuit produced by connecting two parallel circuits, that is, a parallel circuit with the first detection winding 12b and the waveform adjusting section 15 and a parallel circuit with the second detection winding 13b and the waveform adjusting section 16, connected in series as a feedback circuit between an output terminal and an inverting input terminal. Here, the voltage across the ends of the second detection winding 13b is inputted into a newly added differential amplifier 22. By doing so, the difference signal V3 that is the voltage difference (V1-V2) between the first voltage signal V1 and the second voltage signal V2 can be generated (outputted) from the differential amplifier 22.

With the configuration described above, by adjusting the values of the variable elements (i.e., the resistance values of the resistance elements 15a and 16a) included in the waveform adjusters 15 and 16 (or 25 and 26), it is possible to adjust the signal waveform of the first voltage signal V1 generated at the second end of the first detection winding 12b and the second voltage signal V2 generated at the second end of the second detection winding 13b, and as a result, it is possible to make one signal waveform out of such signal waveforms approach the other signal waveform.

Also, in the waveform adjusters 15 and 16 (or 25 and 26) described above, it is possible to connect fixed elements of the same type in parallel or in series to the variable elements or to make it possible to change the adjustment ranges of the values as the parallel circuits as a whole or the series circuits as a whole when the value of the variable element is adjusted. More specifically, when the variable element is a variable resistor, it is possible to connect a fixed resistance element (or "fixed resistor") to the variable resistor in parallel or in series so as to change the adjustment range of the resistance value of the parallel circuit (a parallel circuit with the variable resistor and the fixed resistor) as a whole or the adjustment range of the resistance value of the series circuit (a series circuit with the variable resistor and the fixed resistor) as a whole when the resistance value of the variable resistor has been adjusted. Similarly, when the variable element is a variable capacitor, it is possible to connect a fixed capacitance element (or "fixed capacitor") to the variable capacitor in parallel or in series so as to change the adjustment range of the capacitance value of the parallel circuit (a parallel circuit with the variable capacitor and the fixed capacitor) as a whole or the adjustment range of the capacitance value of the series circuit (a series circuit with the variable capacitor and the fixed capacitor) as a whole when the capacitance value of the variable capacitor has been adjusted.

Figure 8:
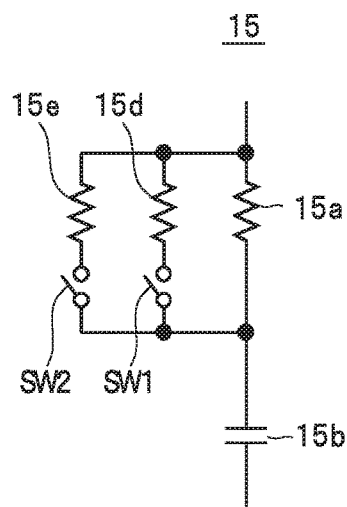
FIG. 8 is another circuit diagram of a waveform adjuster.

Also, although the waveform adjusters 15 and 16 (or 25 and 26) described above use a configuration that uses a variable element (a variable or trimmer capacitor and/or a variable resistor), as depicted in FIGS. 8 and 9, it is also possible to use a configuration equipped with a series circuit with a fixed resistance element 15a and a fixed capacitance element 15b and fixed elements of the same type that are connected in parallel via one of on/off switches and short pads (in the illustrated examples, by on/off switches) to at least one of the resistance element 15a and the capacitance element 15b (in the drawings, to one of the resistance element 15a and the capacitance element 15b). Although the waveform adjuster 15 in FIGS. 8 and 9 is described below as an example, this also applies to the other waveform adjuster 16 (or 25 and 26).

More specifically, the waveform adjuster 15 depicted in FIG. 8 includes a series circuit with the fixed resistance element (fixed resistor) 15a and a fixed capacitance element (fixed capacitor) 15b, a fixed element of the same type (fixed resistor 15d) that is connected in parallel via an on/off switch SW1 to the resistance element 15a, and a fixed element of the same type (fixed resistor 15e) that is connected in parallel via an on/off switch SW2 to the resistance element 15a. Note that although the number of fixed elements of the same type (fixed resistors) that are connected in parallel via on/off switches to the resistance element 15a is two in this example, it is also possible to connect one or three or more of such elements.

The waveform adjuster 15 depicted in FIG. 9 includes a series circuit with the fixed resistance element (fixed resistor) 15a and a fixed capacitance element (fixed capacitor) 15b, a fixed element of the same type (fixed capacitor 15f) that is connected in parallel via an on/off switch SW3 to the capacitance element 15b, and a fixed element of the same type (fixed capacitor 15g) that is connected in parallel via an on/off switch SW4 to the capacitance element 15b. Note that although the number of fixed elements of the same type (fixed capacitors) that are connected in parallel via on/off switches to the capacitance element 15b is two in this example, it is also possible to connect one or three or more of such elements.

In this way, by constructing the waveform adjusters 15 and 16 (or 25 and 26) described above of a series circuit with the fixed resistance element 15a and the fixed capacitance element 15b, and fixed elements of the same type connected in parallel via on/off switches to one out of the resistance element 15a and the capacitance element 15b, by switching the on/off switches, it is possible to adjust the overall value of a circuit (parallel circuit) constructed of one element out of the resistance element 15a and the capacitance element 15b and the elements of the same type that are connected in parallel to such element. This means that compared to a configuration that uses a variable element, it is possible to reduce the adjustment time taken to make one signal waveform, out of the signal waveform of the first voltage signal V1 generated at the second end of the first detection winding 12b and the signal waveform of the second voltage signal V2 generated at the second end of the second detection winding 13b, approach the other signal waveform. Note that when a short pad is used in place of an on/off switch, the overall value of a circuit (parallel circuit) constructed of one element out of the resistance element 15a and the capacitance element 15b and the element of the same type that is connected in parallel to such element is adjusted by shorting the short pads using solder or the like. Also, by providing both on/off switches (or short pads) and variable elements and adjusting first using the on/off switches (or short pads) and performing adjustment with a variable element when the intended adjustment result could not be obtained, it is possible to reduce the adjustment time compared to adjustment that uses only a variable element. For example, the short pads may be as illustrated in FIGS. 10 and 11.

Also, although not illustrated, while it is possible to use a configuration equipped with a series circuit with a fixed resistance element 15a and a fixed capacitance element 15b and fixed elements of the same type (that is, resistance elements for the resistance element 15a and capacitance elements for the capacitance element 15b) respectively connected in parallel to the resistance element 15a and the capacitance element 15b and doing so increases the freedom of adjustment, the increase in the number of combinations means that the time taken by adjustment also increases. For this reason, a configuration where fixed elements of the same type are connected in parallel via on/off switches or short pads to only one of the resistance element 15a and the capacitance element 15b as described above is preferable.

Also, although the measuring device MD uses a configuration that includes the processor 2 and the outputter 3 in addition to the current sensor 1, it is also possible to use a configuration equipped with a voltmeter that measures the detection signal So outputted from the current sensor 1 in place of the processor 2 and the outputter 3, or a configuration equipped with a digital multimeter with a voltage measuring function in place of such voltmeter.

This measuring device MD may be configured to include a voltage measuring function aside from the current measuring function, and may also be a configuration equipped with other measuring functions, such as a resistance measuring function that measures resistance based on the measured current value and voltage value and a power measuring function that measures power.

What is claimed is:

1. A current sensor comprising:
a ring-shaped main magnetic core through which a detected object is inserted;
a first fluxgate sensor element with a first sub-magnetic core, which is incorporated in the main magnetic core, and a first detection winding wound around the first sub-magnetic core;
a second fluxgate sensor element with a second sub-magnetic core, which is incorporated in the main magnetic core, and a second detection winding wound around the second sub-magnetic core in an opposite direction to a winding direction of the first detection winding;
a signal generator that outputs excitation signals to the first detection winding and the second detection winding to magnetize the first sub-magnetic core and the second sub-magnetic core with inverted phases;
a detector that outputs a detection signal whose amplitude changes in proportion to a current value of a current flowing in the detected object based on a difference between a first voltage signal generated in the first and a second voltage signal generated in the second detection winding; and
a first waveform adjuster that is connected to the first detection winding and adjusts a signal waveform of the first voltage signal,
wherein the first waveform adjuster includes a series circuit with a resistance element and a capacitance element and is configured so that at least one of the resistance element and the capacitance element is a variable element.

2. The current sensor according to claim 1, comprising a second waveform adjuster that is connected to the second and adjusts a signal waveform of the second voltage signal, wherein the second waveform adjuster includes a series circuit with a resistance element and a capacitance element and is configured so that at least one of the resistance element and the capacitance element is a variable element.

3. The current sensor according to claim 2, wherein the first waveform adjuster is configured so that at least one of the resistance element and the capacitance element is connected via one of an on/off switch and a short pad in parallel to an element of a same type as the at least one of the resistance element and the capacitance element, and the second waveform adjuster is configured so that at least one of the resistance element and the capacitance element is connected via one of an on/off switch and a short pad in parallel to an element of a same type as the at least one of the resistance element and the capacitance element.

4. A measuring device including the current sensor according to claim 3.

5. A measuring device including the current sensor according to claim 2.

6. The current sensor according to claim 1, wherein the first waveform adjuster is configured so that at least one of the resistance element and the capacitance element is connected via one of an on/off switch and a short pad in parallel to an element of a same type as the at least one of the resistance element and the capacitance element.

7. A measuring device including the current sensor according to claim 6.

8. A measuring device including the current sensor according to a claim 1.

* * * * *